(12) United States Patent
Lee et al.

(10) Patent No.: US 10,526,508 B2
(45) Date of Patent: Jan. 7, 2020

(54) SLURRY COMPOSITION FOR CMP AND POLISHING METHOD USING SAME

(71) Applicants: YOUNG CHANG CHEMICAL CO., LTD, Gyeongsangbuk-do (KR); SKC CO., LTD., Suwon-si, Gyeonggi-do (KR)

(72) Inventors: Seung Hun Lee, Daegu (KR); Seung Hyun Lee, Daegu (KR); Su Jin Lee, Daegu (KR); Seong Hwan Kim, Daegu (KR)

(73) Assignees: YOUNG CHANG CHEMICAL CO., LTD., Seongju-Gun, Gyeongsangbuk-Do (KR); SKC CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/762,871

(22) PCT Filed: Sep. 23, 2016

(86) PCT No.: PCT/KR2016/010681
§ 371 (c)(1),
(2) Date: Mar. 23, 2018

(87) PCT Pub. No.: WO2017/052280
PCT Pub. Date: Mar. 30, 2017

(65) Prior Publication Data
US 2018/0230334 A1 Aug. 16, 2018

(30) Foreign Application Priority Data

Sep. 25, 2015 (KR) .......................... 10-2015-0136057
Nov. 6, 2015 (KR) .......................... 10-2015-0155575

(51) Int. Cl.
*C09G 1/02* (2006.01)
*H01L 21/304* (2006.01)
(Continued)

(52) U.S. Cl.
CPC .............. *C09G 1/02* (2013.01); *H01L 21/304* (2013.01); *H01L 21/30625* (2013.01); *H01L 21/3212* (2013.01)

(58) Field of Classification Search
CPC ............ H01L 21/304; H01L 21/30625; H01L 21/3212
(Continued)

(56) References Cited

U.S. PATENT DOCUMENTS

| | | | |
|---|---|---|---|
| 2005/0173669 A1* | 8/2005 | Kurata | C09G 1/02 252/79.1 |
| 2014/0014872 A1* | 1/2014 | Tamada | C09G 1/02 252/79.1 |
| 2015/0024595 A1* | 1/2015 | Dinega | H01L 21/31053 438/693 |

FOREIGN PATENT DOCUMENTS

| | | |
|---|---|---|
| JP | 2013-074036 A | 4/2013 |
| KR | 10-2004-0012510 A | 2/2004 |

(Continued)

*Primary Examiner* — Binh X Tran
(74) *Attorney, Agent, or Firm* — Novick, Kim & Lee, PLLC; Jae Youn Kim (57) ABSTRACT

Provided are a slurry composition for CMP and a polishing method using the same, in which polishing can be performed by freely adjusting the selectivity ratio of a silicon oxide film, a silicon nitride and a polysilicon film through control of the amounts of additive and solvent, and thus the slurry composition can be efficiently applied to the process of manufacturing a semiconductor, requiring selective removal of a silicon nitride film and a polysilicon film relative to a silicon oxide film.

11 Claims, 3 Drawing Sheets

(51) Int. Cl.
*H01L 21/321* (2006.01)
*H01L 21/306* (2006.01)

(58) Field of Classification Search
USPC .................. 252/79.1, 79.4; 438/692, 693
See application file for complete search history.

(56) References Cited

FOREIGN PATENT DOCUMENTS

| | | |
|---|---|---|
| KR | 10-2009-0003985 A | 1/2009 |
| KR | 10-2012-0067701 A | 6/2012 |
| KR | 10-2014-0005963 A | 1/2014 |
| KR | 10-2014-0133604 A | 11/2014 |
| KR | 10-2015-0020614 A | 2/2015 |

\* cited by examiner

SLURRY COMPOSITION FOR CMP AND POLISHING METHOD USING SAME

TECHNICAL FIELD

The present invention relates to a slurry composition for CMP and a polishing method using the same.

BACKGROUND ART

With an increase in the degree of integration of semiconductor devices, variation in the height of structures formed on a semiconductor wafer is increasing. In the case where such height variation is high, it is difficult to accurately print a mask pattern due to problems related to DOF (Depth Of Focus) in a subsequent lithography process.

Thus, in order to flatten the surface of a wafer, chemical-mechanical polishing (hereinafter referred to as "CMP"), in which chemical removal processing and mechanical removal processing are combined into a single process, is widely utilized these days.

Typically, a CMP process is performed in a manner in which a wafer surface having varying height is brought into close contact with a polishing pad, and a slurry, serving as a polishing liquid containing an abrasive and a chemical material, is then injected between the wafer and the polishing pad to thus flatten the surface of the wafer. Briefly, CMP is a process of flattening a semiconductor wafer through removal of a certain film therefrom, and in the CMP process, the uniformity of the polished surface after the polishing is regarded as very important.

The construction for CMP includes a head to which a wafer is mounted, a pad rotating in the same direction, and a slurry containing nano-sized polishing particles therebetween, the wafer being mounted to the head by means of surface tension or a vacuum. In the CMP process, a wafer is polished by the pad and the slurry, and a polishing table equipped with the pad performs a simple rotational motion and the head part simultaneously performs both rotational motion and oscillatory motion and presses the wafer toward the polishing table with a predetermined pressure. The wafer surface and the pad come into contact with each other due to the self-load of the head part and the applied pressure, and the slurry, which is the processing liquid, is allowed to flow into fine gaps between the contact surfaces, that is, into pores in the pad. A mechanical removal process is performed by the polishing particles in the slurry and the surface projections of the pad, and a chemical removal process is conducted by the chemical component in the slurry. Also, polishing particles or surface projections come into contact with top of the protruding portion of the wafer on which the device is formed, and pressure is intensively applied to the protruding portion, and thus the protruding portion has a relatively high surface removal rate compared to the other portions. As the processing progresses, protruding portions are uniformly removed over the entire area. During the flattening process, polishing has to be stopped at the layer where a silicon oxide film appears. The CMP process may be classified into a process type in which only the same material is polished during the processing to thus remove only a predetermined thickness and a process type in which a polishing end point is determined while coming into contact with a different kind of material. In the case where the polishing rate of a layer that must not be polished is significantly lower than the polishing rate of a material to be polished during the processing, the polishing end point (PEP) may be naturally determined due to slight over-polishing. Here, the polishing ratio of two materials is referred to as a selectivity ratio. The slurry used in the CMP process is configured such that an abrasive that realizes a predetermined selectivity ratio should be mixed with a solution in an atmosphere that may cause a chemical reaction. Specifically, during the damascene process, there is required a slurry, in which the polishing ratio of two materials is different, that is, the selectivity ratio is different, in a manner in which a silicon nitride film is preferentially polished and polishing is stopped at the time that a silicon oxide film being exposed. Furthermore, there is required a slurry, which causes no damage to a metal layer and improves the electrical properties of a device. However, conventionally developed slurry cannot be used in the damascene gate process because the polishing rate of a silicon oxide film is much higher than that of a silicon nitride film. The effectiveness of the CMP process depends mainly on the properties of the slurry, so the development of an optimal slurry composition for CMP is required.

Meanwhile, the surface to be polished during CMP exposes various kinds of materials, such as a polysilicon film (polycrystalline silicon film), a monocrystalline silicon film, a silicon oxide film, a silicon nitride film, etc. Conventionally, a slurry composition for CMP, which is targeted to any one of the above materials, is used to remove the target material through CMP. However, when the polishing rate of the target material is significantly different from that of another material, the target material is excessively polished, undesirably causing defects such as dishing or erosion. Also, since the processing is carried out in a manner in which a CMP slurry composition suitable for each of the target materials is selected and a removal process is performed through CMP, productivity is lowered, which is undesirable.

With the recent diversification of the structure of semiconductor devices, three kinds of films, namely a polysilicon film, a silicon oxide film and a silicon nitride film, are required to be simultaneously polished. In order to simultaneously polish the three kinds of films, it is necessary to develop a slurry composition, which may perform a polishing process by adjusting the selectivity ratio of the films with the slurry composition alone for CMP, apart from the steps of selecting a slurry suitable for each polishing target and supplying the slurry.

Regarding techniques capable of performing a polishing process by adjusting the selectivity ratio of the films with the slurry composition alone for CMP, Korean Patent No. 1396853 discloses [Slurry composition for polishing silicon nitride, method of polishing silicon nitride film using the same, and method of manufacturing semiconductor device], in which the slurry composition for polishing silicon nitride enables a silicon nitride film to be polished at a high polishing selectivity ratio relative to a silicon oxide film, and may thus be efficiently applied to the process of manufacturing a semiconductor, which requires selective removal of the silicon nitride film. Also, Korean Patent Application Publication No. 2014-0133604 discloses ⇆CMP composition selective for oxide and nitride having high removal rate and low defectivity], in which the CMP composition is composed of a ceria abrasive, one or more nonionic polymers, optionally one or more phosphonic acids, optionally one or more nitrogen-containing zwitterionic compounds, optionally one or more sulfonic acid copolymers, optionally one or more anionic copolymers, optionally one or more polymers comprising quaternary amines, optionally one or more compounds that adjust the pH of the polishing composition, water, and optionally one or more additives, thus exhibiting preferable selectivity of silicon oxide, silicon nitride and/or polysilicon. Also, the method of chemically and mechanically polishing a substrate including silicon oxide, silicon nitride and/or polysilicon using the above CMP composition is disclosed.

Therefore, the present invention is aimed to a slurry composition for CMP, which enables polishing by adjusting the selectivity ratio of the films through control of amounts of an additive and a solvent, without the need to use a separate slurry suitable for each film (a silicon oxide film, a silicon nitride film and a polysilicon film) depending on the polishing target.

DISCLOSURE

Technical Problem

Accordingly, the present invention is intended to provide a slurry composition for CMP, which enables polishing by freely adjusting the polishing selectivity ratio of a silicon oxide film, a silicon nitride film and a polysilicon film, and may thus be efficiently applied to the process of manufacturing a semiconductor, requiring the selective removal of a silicon oxide film, a silicon nitride film and a polysilicon film. In particular, unlike conventional slurry having a high polishing rate for a silicon oxide film, the slurry composition for CMP of the present invention is capable of polishing a silicon nitride film and a polysilicon film at a high polishing selectivity ratio relative to a silicon oxide film.

In addition, the present invention is intended to provide a polishing method using the slurry composition for CMP.

Technical Solution

Therefore, the present invention provides a slurry composition for CMP, suitable for polishing by adjusting the selectivity ratio of a silicon oxide film, a silicon nitride film and a polysilicon film, the slurry composition for CMP including: an abrasive comprising colloidal silica; at least one additive selected from the group consisting of polyethylene glycol, a heterocyclic compound and an organic acid; and a solvent.

In a preferred embodiment of the present invention, the colloidal silica has a particle size of 10 to 120 nm.

In a preferred embodiment of the present invention, the heterocyclic compound contains at least two nitrogen atoms, and may include at least one selected from the group consisting of 1,2,4H-triazole, 5-methyl benzotriazole, tetrazole, imidazole, 1,2-dimethyl imidazole, and piperazine.

In a preferred embodiment of the present invention, the organic acid is a compound containing carboxylic acid, and may include at least one selected from the group consisting of succinic acid, glutaric acid, and adipic acid.

In a preferred embodiment of the present invention, the additive is composed of polyethylene glycol, which is able to adjust the selectivity ratio of a polysilicon film, and a heterocyclic compound and an organic acid, which are able to adjust the selectivity ratio of a silicon nitride film.

In a preferred embodiment of the present invention, the slurry composition for CMP includes, based on the total weight of the composition, 0.2 to 10 wt % of an abrasive comprising colloidal silica, 0.001 to 7 wt % of at least one additive selected from the group consisting of polyethylene glycol, a heterocyclic compound and an organic acid, and the remainder of a solvent.

In a preferred embodiment of the present invention, the additive comprises polyethylene glycol, the heterocyclic compound and the organic acid at a ratio of 0~5.0:0~5.0:0~5.0.

In a preferred embodiment of the present invention, the slurry composition for CMP further includes a water-soluble polymer.

In a preferred embodiment of the present invention, the water-soluble polymer may include at least one selected from the group consisting of polyvinyl alcohol, polyvinyl pyrrolidone, polyacrylic acid and hydroxyethyl cellulose, and is used in an amount of 0.001 to 5 wt % based on the total weight of the composition.

In a preferred embodiment of the present invention, the slurry composition for CMP has a pH of 3 to 5.

In a preferred embodiment of the present invention, the slurry composition for CMP simultaneously polishes films to be polished, including at least two selected from among a silicon oxide film, a silicon nitride film and a polysilicon film.

In a preferred embodiment of the present invention, the polishing selectivity ratio of the silicon oxide film, the silicon nitride film and the polysilicon film upon the polishing is 1:1~50:1~50.

In a preferred embodiment of the present invention, the slurry composition for CMP is used in the form of a single slurry in which an additive is incorporated in an abrasive.

In addition, the present invention provides a polishing method using the slurry composition for CMP, comprising polishing a semiconductor wafer using the aforementioned slurry composition for CMP.

In the polishing method according to a preferred embodiment of the present invention, an abrasive and an additive are individually injected, whereby the polishing is performed by adjusting the selectivity ratio of a silicon oxide film, a silicon nitride film and the polysilicon film through control of the amount of the additive.

In a preferred embodiment of the present invention, the polishing is performed by adjusting the selectivity ratio of the polysilicon film through the control of the amount of polyethylene glycol as the additive, and the polishing is performed by adjusting the selectivity ratio of the silicon nitride film through the control of the amounts of a heterocyclic compound and an organic acid.

In a preferred embodiment of the present invention, the additive comprises polyethylene glycol, a heterocyclic compound and an organic acid at a ratio of 0~5.0:0~5.0:0~5.0.

Advantageous Effects

According to the present invention, a slurry composition for CMP is capable of polishing a silicon nitride film and a polysilicon film at a high polishing selectivity ratio relative to a silicon oxide film, and can thus be efficiently applied to the process of manufacturing a semiconductor, which requires selective removal of a silicon nitride film and a polysilicon film. Moreover, the slurry composition for CMP of the present invention obviates the need to select a slurry suitable for each polishing target film, thereby improving production efficiency.

BEST MODE

Unless otherwise defined, all the technical and scientific terms used herein have the same meanings as those typically understood by those skilled in the art to which the present invention belongs. Generally, the nomenclature used herein is well known in the art and is typical.

As used herein, when any part is said to "include" any element, this does not mean that other elements are excluded, and such other elements may be further included unless otherwise specifically mentioned.

Typically, slurry in a CMP (Chemical-Mechanical Polishing; hereinafter, referred to as "CMP") includes those including an abrasive and an additive, and also, as a unified product, an abrasive alone is called a slurry. The present invention pertains to a technique for changing the selectivity ratio of films to be polished while varying the amounts of abrasive and additive, and thus the slurry is described as including an abrasive and an additive. In some cases, however, a single slurry composition may be prepared by incorporating an additive in an abrasive.

As used herein, the term "removal rate" refers to the extent of cutting of the film of a wafer during a CMP process, that is, the rate of removal of a film.

As used herein, the term "selectivity ratio" refers to different removal rates for different materials under the same polishing conditions.

Hereinafter, a detailed description will be given of a slurry composition for CMP and a polishing method using the same according to the present invention.

Although a typical slurry composition for CMP is able to most efficiently polish a silicon oxide film, the slurry composition of the present invention decreases the selectivity ratio of a silicon oxide film to thus minimize the removal rate of the silicon oxide film, and may adjust the selectivity ratio of a silicon nitride film and a polysilicon film relative to a silicon oxide film depending on the structural features of the device, whereby the silicon nitride film and the polysilicon film may be polished by freely adjusting the removal rates thereof so as to increase or decrease the same.

The factor for adjusting the selectivity ratio of the silicon oxide film, the silicon nitride film and the polysilicon film includes control of the amounts of additive and solvent, which are components of the slurry composition for CMP. When the amounts of the additive and solvent are adjusted, an optimal selectivity ratio suitable for each CMP process may be applied, and thus a semiconductor wafer may be polished.

Although the slurry conventionally used during the manufacture of a semiconductor is disadvantageous because the slurry must be replaced during the processing depending on the polishing target, the slurry, which is to be developed in the present invention, may be used alone for various devices and processes, whereby polishing may be performed by adjusting the selectivity ratio of a silicon oxide film, a silicon nitride film and a polysilicon film through control of the amounts of additive and solvent. Accordingly, the polishing process may be continuously carried out, without the need to replace the slurry during the processing depending on the polishing target.

An embodiment of the present invention addresses a slurry composition for CMP, suitable for polishing by adjusting the selectivity ratio of a silicon oxide film, a silicon nitride film and a polysilicon film, including an abrasive comprising colloidal silica, at least one additive selected from the group consisting of polyethylene glycol, a heterocyclic compound and an organic acid, and a solvent.

The colloidal silica is a colloidal solution in which nano-sized silica particles do not precipitate but are stably dispersed in a solvent. The colloidal silica preferably has a particle size of 10 to 120 nm, in order to appropriately maintain scratch resistance and removal rate, and the particle size of 30 to 80 nm is more preferable. If the particle size of the colloidal silica is less than 10 nm, the removal rate of the film may decrease and thus the processing time may increase. On the other hand, if the particle size thereof exceeds 120 nm, resistance to scratching may decrease, which is undesirable.

In the slurry composition for CMP according to an embodiment of the present invention, the additive may be composed of polyethylene glycol, which is able to adjust the selectivity ratio of a polysilicon film, and a heterocyclic compound and an organic acid, which are able to adjust the selectivity ratio of a silicon nitride film. When the amount of polyethylene glycol of the additive is increased, the polishing rate of the polysilicon film may be greatly decreased due to the properties of a powder emulsifier as a nonionic surfactant, and when the amounts of heterocyclic compound and organic acid of the additive are increased, inhibition of sedimentation and aggregation and the polishing rate of the silicon nitride film may be increased.

Here, the heterocyclic compound contains at least two nitrogen atoms, and may include at least one selected from the group consisting of 1,2,4H-triazole, 5-methyl benzotriazole, tetrazole, imidazole, 1,2-dimethyl imidazole, and piperazine.

Also, the organic acid is a compound containing carboxylic acid, and may include at least one selected from the group consisting of succinic acid, glutaric acid, and adipic acid.

In the slurry composition for CMP according to an embodiment of the present invention, the solvent is used to adjust the concentration of the composition to thus control the film removal rate, and may be employed in diluting the additive, and the solvent may include deionized water, water, etc., deionized water being most preferably used.

The slurry composition for CMP may include, based on the total weight of the composition, 0.2 to 10 wt % of the abrasive comprising colloidal silica, 0.001 to 7 wt % of at least one additive selected from the group consisting of polyethylene glycol, a heterocyclic compound and an organic acid, and the remainder of the solvent.

The abrasive comprising colloidal silica, that is, colloidal silica, is preferably used in an amount of 0.2 to 10 wt % based on the total weight of the composition. If the amount of colloidal silica is less than 0.2 wt %, the removal rate may be decreased due to the lack of solid content. On the other hand, if the amount thereof exceeds 10 wt %, aggregation may occur due to the excessive amount thereof, which is undesirable.

At least one additive selected from the group consisting of polyethylene glycol, a heterocyclic compound and an organic acid is preferably used in an amount of 0.001 to 7 wt % based on the total weight of the composition. If the amount of the additive is less than 0.001 wt %, the action of the additive is hardly exhibited due to the small amount of the additive. On the other hand, if the amount thereof exceeds 7 wt %, other additives, added therewith, may not perform their functions owing to the excessive inclusion of the corresponding additive, which is undesirable.

Here, when the ratio of polyethylene glycol, heterocyclic compound and organic acid in the additive is 0~5.0:0~5.0:0~5.0, the polishing selectivity ratio of the silicon oxide film, the silicon nitride film and the polysilicon film preferably falls in the range of 1:1~50:1~50, whereby the selectivity ratio of the silicon nitride film and the polysilicon film relative to the silicon oxide film may be adjusted and thus an increase or decrease in the removal rate thereof may be freely adjusted upon the polishing process.

The slurry composition for CMP may further include a water-soluble polymer that is able to adjust the selectivity ratio of the silicon nitride film. The water-soluble polymer may include at least one selected from the group consisting of polyvinyl alcohol, polyvinyl pyrrolidone, polyacrylic acid, and hydroxyethyl cellulose. The water-soluble polymer is preferably used in an amount of 0.001 to 5 wt % based on the total weight of the composition. If the amount of the water-soluble polymer is less than 0.001 wt %, the action of the additive is hardly exhibited due to the small amount of the additive. On the other hand, if the amount thereof exceeds 5 wt %, other additives, added therewith, may not perform their functions, which is undesirable.

The slurry composition for CMP according to an embodiment of the present invention preferably has a pH of 3 to 5 in order to ensure the stability thereof. If the pH of the composition is less than 3, the removal rate becomes unstable. On the other hand, if the pH thereof exceeds 5, aggregation of colloidal particles occurs, and the removal rate becomes unstable. In order to obtain the pH in the above range, basic materials, such as KOH, $NH_4OH$, NaOH, TMAH, TBAH, $HNO_3$, etc., may be used alone or in combination with each other, and as acidic materials, inorganic acids, such as nitric acid, sulfuric acid, hydrochloric acid, etc., may be used alone or in combination with each other. Since the pH is closely associated with the polishing rate of the silicon oxide film, silicon nitride film and polysilicon film, it has to be precisely controlled.

As described above, the slurry composition for CMP according to the present invention is capable of simultaneously polishing films to be polished, including at least two selected from among a silicon oxide film, a silicon nitride film and a polysilicon film, through the control of the amounts of additive and solvent. Here, the slurry composition for CMP may have a polishing selectivity ratio of a silicon oxide film, a silicon nitride film and a polysilicon film of 1:1~50:1~50. The removal rate (polishing rate) of silicon oxide may be 20 to 200 Å/min, the removal rate (polishing rate) of the polysilicon film may be 20 to 1500 Å/min, and the removal rate (polishing rate) of the silicon nitride film may be 200 to 2000 Å/min. During the semiconductor process, in which the silicon oxide film is exposed, the silicon nitride film and the polysilicon film may be polished at a high polishing selectivity ratio, and thus the slurry composition of the invention may be efficiently applied to the process of manufacturing a semiconductor, which requires selective removal of a silicon nitride film and a polysilicon film.

For example, in the case where the selectivity ratio of the silicon oxide film is decreased and the selectivity ratio of the silicon nitride film and the polysilicon film is changed, in order to increase the selectivity ratio of the polysilicon film, polyethylene glycol, a heterocyclic compound and an organic acid as the additive for the polysilicon film may be used at a ratio of 0~5.0:0~5.0:0~5.0 to thus adjust the selectivity ratio (e.g. silicon oxide film to polysilicon film to silicon nitride film=1:1~30:5~30).

In another example, in the case where the selectivity ratio of the silicon oxide film is decreased and the selectivity ratio of the silicon nitride film and the polysilicon film is changed, in order to increase the selectivity ratio of the silicon nitride film, polyethylene glycol, a heterocyclic compound and an organic acid as the additive for the silicon nitride film may be used at a ratio of 0~5.0:0~5.0:0~5.0 to thus adjust the selectivity ratio (e.g. silicon oxide film to polysilicon film to silicon nitride film=1:1~5:5~30).

In a further example, in the case where the selectivity ratio of the silicon oxide film is decreased and the selectivity ratio of the silicon nitride film and the polysilicon film is changed, in order to increase the selectivity ratio of the silicon nitride film and the polysilicon film, polyethylene glycol, a heterocyclic compound and an organic acid as the additive may be used at a ratio of 0~5.0:0~5.0:0~5.0 to thus adjust the selectivity ratio (e.g. silicon oxide film to polysilicon film to silicon nitride film=1:5~15:5~15).

Also, the slurry composition for CMP according to the present invention enables polishing by adjusting the selectivity ratio of the silicon oxide film, the silicon nitride film and the polysilicon film. As necessary, some other films may be polished. For example, in the case of a trench structure, the slurry composition for CMP according to the present invention may be usefully applied to the polishing of a bulk film. Moreover, a pipe channel region may be formed using a sacrificial film, and when the structure is formed through a CMP process, the use of slurry having various properties is necessary to minimize changes in the trench due to dishing or over-CMP of the pipe channel. As such, the slurry composition for CMP according to the present invention, which is able to adjust the selectivity ratio of films, may be applied.

The slurry composition for CMP may be provided in the form of a single slurry in which an additive is incorporated in an abrasive.

Another embodiment of the present invention addresses a polishing method using the slurry composition for CMP, comprising polishing a semiconductor wafer using the slurry composition for CMP. In the polishing method, an abrasive and an additive are individually injected, whereby polishing may be performed by adjusting the selectivity ratio of a silicon oxide film, a silicon nitride film and a polysilicon film through control of the amount of the additive.

Figure 1:
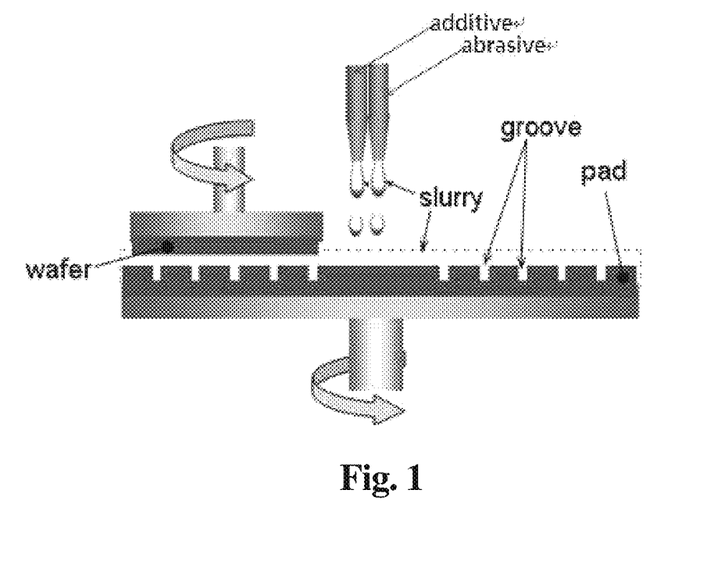
FIG. 1 schematically shows a polishing process for a wafer and a pad of a CMP machine.

An example of the polishing method using the slurry composition for CMP is as follows. In FIG. 1, which schematically shows the polishing for a wafer and a pad of a CMP machine, a slurry composition for CMP is first supplied to a polishing pad on a polishing table, and is brought into contact with a surface to be polished, and the surface to be polished is polished through motion relative to the polishing pad. A typical polishing device comprising a holder for grasping a semiconductor substrate and a polishing table equipped with a polishing pad may be used. The polishing pad may be formed of a typical nonwoven fabric, foamed polyurethane, a porous fluorine resin, etc. During the polishing process, the slurry composition for CMP is continuously supplied to the polishing pad through individual lines of an abrasive and an additive using a pump or the like. Although the supply amount is not limited, it is preferred that the surface of the polishing pad always be covered with the abrasive. Here, the polishing is performed by adjusting the selectivity ratio of the polysilicon film through control of the amount of polyethylene glycol as the additive, and the polishing is performed by adjusting the selectivity ratio of the silicon nitride film through control of the amounts of heterocyclic compound and organic acid. Here, the additive may comprise polyethylene glycol, the heterocyclic compound and the organic acid at a ratio of 0~5.0:0~5.0:0~5.0. After termination of the polishing process, the semiconductor substrate is thoroughly cleaned with flowing water, and water drops are removed from the semiconductor substrate and thus the semiconductor substrate may be dried using a spin dryer, a lamp, etc. The treatment subject may be a semiconductor substrate having a surface to be polished, including at least two selected from among a polysilicon film, a silicon nitride film and a silicon oxide film.

A typical slurry composition for CMP is able to most efficiently polish a silicon oxide film, whereas the slurry composition for CMP according to the present invention is capable of polishing a silicon oxide film, a silicon nitride film and a polysilicon film at a high polishing selectivity ratio and may thus be usefully applied to the process of manufacturing a semiconductor having a surface to be polished, including three kinds of films, namely a polysilicon film, a silicon nitride film and a silicon oxide film. The slurry composition for CMP of the invention obviates the need to select a slurry suitable for each polishing target, thus improving production efficiency.

Figure 2:
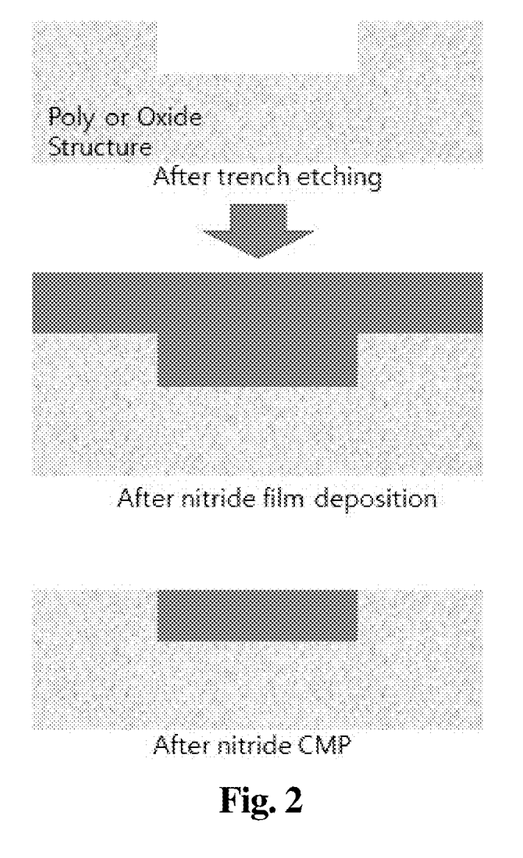
FIG. 2 is of cross-sectional views showing the process of polishing a silicon nitride film according to an embodiment of the present invention.

The method of polishing a silicon nitride film according to an embodiment of the present invention is illustrated in FIG. 2. As shown in FIG. 2, polyethylene glycol, a heterocyclic compound and an organic acid in the additive are added at a ratio of 0~5.0:0~5.0:0~5.0 through control of the amount of the additive of the slurry composition for CMP according to the present invention, thus increasing the polishing selectivity ratio of a silicon nitride film relative to a silicon oxide film or a polysilicon film, thereby selectively polishing the silicon nitride film (e.g. silicon oxide film to polysilicon film to silicon nitride film=1:1:50).

Figure 3:
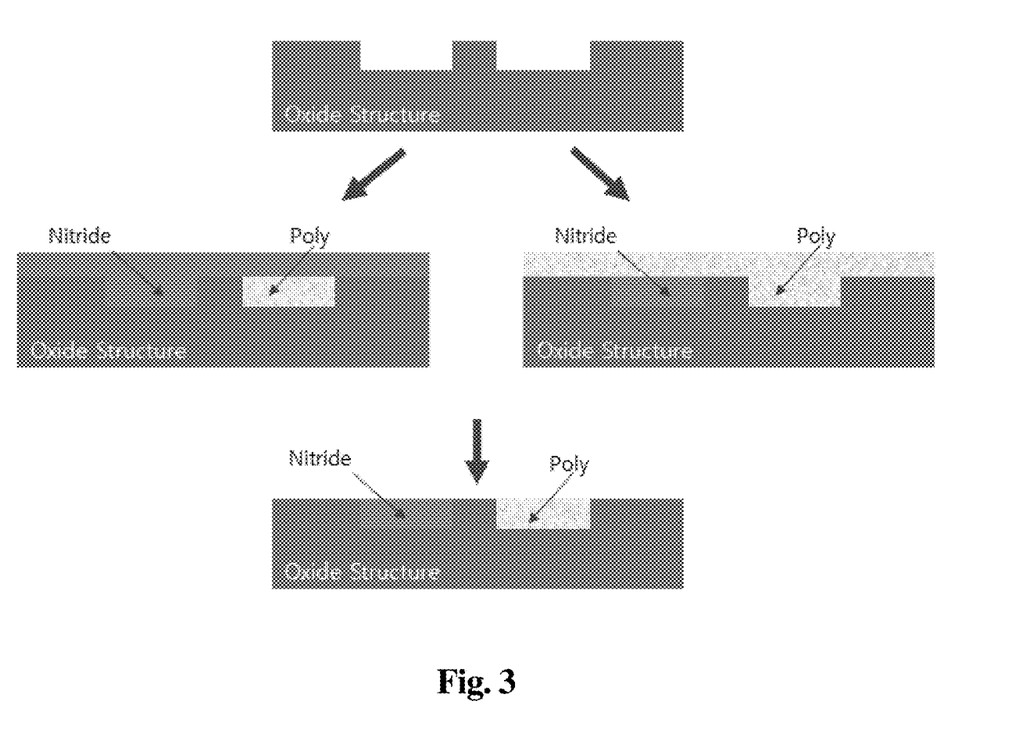
FIG. 3 is of cross-sectional views showing the process of polishing a silicon nitride film and a polysilicon film according to an embodiment of the present invention.

The method of polishing a silicon nitride film and a polysilicon film according to another embodiment of the present invention is illustrated in FIG. 3. As shown in FIG. 3, the slurry composition for CMP according to the present invention is configured such that an additive is incorporated in an abrasive. In order to polish the silicon nitride film and the polysilicon film after various processes, as in the structure of FIG. 3, a slurry that is able to decrease the selectivity ratio of the silicon oxide film and to increase the selectivity ratio of the silicon nitride film and the polysilicon film, resulting from adding polyethylene glycol, a heterocyclic compound and an organic acid in the additive at a ratio of 0~5.0:0~5.0:0~5.0, is used, thereby polishing the silicon nitride film and the polysilicon film in the trench region and minimizing changes in height in the trench region due to the high selectivity ratio relative to the silicon oxide film (e.g. silicon oxide film to polysilicon film to silicon nitride film=1:20:20).

The slurry composition for CMP as above inhibits polishing of the silicon oxide film and facilitates polishing of the silicon nitride film and the polysilicon film. In order to fill one of two trench structures with a polysilicon film and fill the remaining one with a silicon nitride film, two trenches are deposited with the same kind of film, for example, a silicon nitride film or a polysilicon film, followed by a mask-patterning process, after which a cleaning process or an etching process is carried out to thus remove the film of one trench. Thereafter, the empty trench is filled with a different kind of film, followed by a CMP process using the slurry, which inhibits the polishing of the silicon oxide film and facilitates the polishing of the silicon nitride film and the polysilicon film, thereby obtaining a trench structure configured such that one of two trenches is filled with the polysilicon film and the remaining one trench is filled with the silicon nitride film.

Mode for Invention

EXAMPLES

A better understanding of the present invention may be obtained through the following examples, which are set forth to illustrate, but are not to be construed as limiting the scope of the present invention, as will be apparent to those skilled in the art.

Example 1

As an abrasive, colloidal silica was prepared, and an additive containing polyethylene glycol, a heterocyclic compound such as 5-methyl benzotriazole and an organic acid such as glutaric acid was mixed with deionized water as a solvent, whereby the abrasive and the additive were separately prepared to give a slurry composition for CMP suitable for polishing by adjusting the selectivity ratio of a silicon oxide film, a silicon nitride film and a polysilicon film through control of the amount of the additive via the additive line. The slurry composition for CMP thus obtained was added with a pH controller, namely KOH or $HNO_3$, and thus the pH thereof was adjusted to 3.5. The amounts of the slurry components contained in the slurry composition for CMP are shown in Table 1 below.

Examples 2 to 10

Slurry compositions for CMP were obtained in the same manner as in Example 1, with the exception that the kinds of additive and the amounts of abrasive, additive and solvent were changed. The amounts of the slurry components contained in the slurry compositions for CMP are shown in Table 1 below.

TABLE 1

| | | Additive (wt %) | | | |
|---|---|---|---|---|---|
| | Colloidal silica (wt %) | Polyethylene glycol | Organic acid (Glutaric acid) | Heterocyclic compound (5-methyl benzotriazole) | pH |
| Ex. 1 | 2 | 0.5 | 0.025 | 0.05 | 3.5 |
| Ex. 2 | 2 | 0.4 | 0.025 | 0.025 | 3.5 |
| Ex. 3 | 2 | 0.4 | 0.025 | — | 3.5 |
| Ex. 4 | 2 | 0.45 | 0.025 | 0.025 | 3.5 |
| Ex. 5 | 1.5 | 0.5 | 0.025 | 0.05 | 3.5 |
| Ex. 6 | 2 | 0.2 | 0.025 | — | 3.5 |
| Ex. 7 | 2 | — | 0.025 | — | 3.5 |
| Ex. 8 | 2.5 | 0.8 | 0.025 | — | 3.5 |
| Ex. 9 | 3.0 | 1.0 | 0.5 | 0.025 | 3.5 |
| Ex.10 | 3.5 | 1.4 | 1.0 | 0.025 | 3.5 |

Evaluation of Polishing Rate Using CMP Slurry Composition

The polishing rates of a silicon oxide film, a silicon nitride film and a polysilicon film were evaluated using the CMP slurry compositions of Examples 1 to 10. Here, a CMP machine, made by CTS, was used.

The results of measurement of the polishing rates of a silicon oxide film, a silicon nitride film and a polysilicon film using the CMP slurry compositions are shown in Table 2 below.

TABLE 2

| | Removal rate (=Polishing rate, Å/min) | | | Selectivity ratio (Silicon oxide film to silicon nitride film to polysilicon film) |
| --- | --- | --- | --- | --- |
| | Silicon oxide film | Silicon nitride film | Polysilicon film | |
| Ex. 1 | 30 | 550 | 100 | 1:18.3:3.3 |
| Ex. 2 | 30 | 550 | 109 | 1:18.3:3.6 |
| Ex. 3 | 30 | 600 | 150 | 1:20.0:5.0 |
| Ex. 4 | 50 | 600 | 150 | 1:12.0:3.0 |
| Ex. 5 | 50 | 500 | 150 | 1:10.0:3.0 |
| Ex. 6 | 50 | 600 | 450 | 1:12.0:9.0 |
| Ex. 7 | 40 | 600 | 886 | 1:15.0:22.2 |
| Ex. 8 | 50 | 500 | 100 | 1:10:2 |
| Ex. 9 | 50 | 600 | 70 | 1:12:1.4 |
| Ex. 10 | 50 | 750 | 50 | 1:15:1 |

As is apparent from Table 2, Examples 1 to 10 were confirmed to increase the polishing selectivity ratio of the silicon nitride film and the polysilicon film relative to the silicon oxide film. In particular, the polishing selectivity ratio of the silicon oxide film to the silicon nitride film was greatly increased to 1:10 or more.

In conclusion, when the slurry composition for CMP according to the present invention is used, a silicon nitride film and a polysilicon film can be polished at a high selectivity ratio relative to a silicon oxide film, and thus the slurry composition for CMP according to the present invention can be efficiently applied to the process of manufacturing a semiconductor, which requires selective removal of a silicon nitride film and a polysilicon film.

All simple modifications or variations of the present invention may be easily performed by those skilled in the art, and may be incorporated in the scope of the present invention.

The invention claimed is:

1. A slurry composition for chemical-mechanical polishing (CMP), suitable for polishing by adjusting a selectivity ratio of a silicon oxide film, a silicon nitride film and a polysilicon film, comprising:
   0.2 to 10 wt % of an abrasive comprising colloidal silica;
   0.001 to 7 wt % of an additive including A) glutaric acid and 5-methyl benzotriazole and including B) polyethylene glycol; and
   a remainder of a solvent,
   wherein the additive comprises the polyethylene glycol, the 5-methyl benzotriazole and the glutaric acid at a ratio of 0~5.0:0~5.0:0~5.0, the polyethylene glycol, the glutaric acid, and the 5-methyl benzotriazole being added in ratios exceeding 0, and
   a polishing selectivity ratio of the silicon oxide film, the silicon nitride film, and the polysilicon film upon the polishing is 1:10~20:1~22.2.

2. The slurry composition for CMP of claim 1, wherein the colloidal silica has a particle size of 10 to 120 nm.

3. The slurry composition for CMP of claim 1, wherein the polyethylene glycol is configured to adjust a selectivity ratio of the polysilicon film, and the 5-methyl benzotriazole and the glutaric acid are configured to adjust a selectivity ratio of the silicon nitride film.

4. The slurry composition for CMP of claim 1, wherein the slurry composition for CMP has a pH of 3 to 5.

5. The slurry composition for CMP of claim 1, wherein the slurry composition for CMP simultaneously polishes films to be polished, including at least two selected from among the silicon oxide film, the silicon nitride film and the polysilicon film.

6. The slurry composition for CMP of claim 1, wherein the slurry composition for CMP is used in a form of a single slurry by incorporating the additive in the abrasive.

7. The slurry composition for CMP of claim 1, further comprising a water-soluble polymer.

8. The slurry composition for CMP of claim 7, wherein the water-soluble polymer includes at least one selected from the group consisting of polyvinyl alcohol, polyvinyl pyrrolidone, polyacrylic acid and hydroxyethyl cellulose, and is used in an amount of 0.001 to 5 wt % based on a total weight of the composition.

9. A polishing method using a slurry composition for CMP, comprising polishing a semiconductor wafer using the slurry composition for CMP of claim 1.

10. The polishing method of claim 9, wherein the abrasive and additive are individually injected, whereby the polishing is performed by adjusting a selectivity ratio of the silicon oxide film, the silicon nitride film, and the polysilicon film through control of an amount of the additive.

11. The polishing method of claim 9, wherein the polishing is performed by adjusting a selectivity ratio of the polysilicon film through control of an amount of the polyethylene glycol as the additive, and the polishing is performed by adjusting a selectivity ratio of the silicon nitride film through control of amounts of the 5-methyl benzotriazole and glutaric acid.

* * * * *